(12) United States Patent
Huang et al.

(10) Patent No.: US 7,495,514 B2
(45) Date of Patent: Feb. 24, 2009

(54) LOW NOISE AMPLIFIER

(75) Inventors: Da-Rong Huang, Tainan (TW);
Huey-Ru Chuang, Tainan (TW);
Yuan-Kai Chu, Hsinhua (TW)

(73) Assignees: Himax Technologies Limited, Tainan County (TW); NCKU Research and Development Foundation, Tainan (TW)

( * ) Notice: Subject to any disclaimer, the term of this patent is extended or adjusted under 35 U.S.C. 154(b) by 223 days.

(21) Appl. No.: 11/356,293

(22) Filed: Feb. 17, 2006

(65) Prior Publication Data

US 2006/0198176 A1  Sep. 7, 2006

Related U.S. Application Data

(60) Provisional application No. 60/653,997, filed on Feb. 18, 2005.

(51) Int. Cl.
*H03G 3/12* (2006.01)
(52) U.S. Cl. .................... 330/282; 330/86; 330/99; 330/260; 330/283; 330/310
(58) Field of Classification Search ............ 330/51, 330/86, 133, 136, 278, 279, 282, 283, 310, 330/98, 99, 254, 260, 291
See application file for complete search history.

(56) References Cited

U.S. PATENT DOCUMENTS

| 6,351,183 B1 * | 2/2002 | Khabbaz et al. ............... 330/51 |
| 6,630,861 B2 * | 10/2003 | Kawaoka ..................... 330/133 |
| 6,693,492 B2 * | 2/2004 | Desize ....................... 330/283 |

OTHER PUBLICATIONS

Huang, Da-Rong, Research on Differential CMOS RFICs for WLAN and DTV Broadband RF Tuner Applications, Thesis for Master of Science, Department of Electrical Engineering, National Cheng Kung University, Tainan, Taiwan, ROC, Jun. 2004.

* cited by examiner

*Primary Examiner*—Khanh V Nguyen
(74) *Attorney, Agent, or Firm*—Rabin & Berdo, P.C.

(57) ABSTRACT

A low noise amplifier including a first-stage signal amplifier, a second-stage signal amplifier and a gain control unit is disclosed. The first-stage signal amplifier is for receiving an input signal and outputting a first output signal accordingly. The second-stage signal amplifier is coupled to the first-stage signal amplifier for outputting a second output signal according to the first output signal. The second-stage signal amplifier includes a first output transistor for outputting the second output signal. The gain control unit includes a first variable resistance device coupled to an input terminal of the first output transistor for adjusting voltage gain of the second output signal.

10 Claims, 2 Drawing Sheets

LOW NOISE AMPLIFIER

This application claims the benefit of U.S. provisional application Ser. No. 60/653,997, filed Feb. 18, 2005, the subject matter of which is incorporated herein by reference.

BACKGROUND OF THE INVENTION

1. Field of the Invention

The invention relates in general to a low noise amplifier (LNA), and more particularly to a broad-band gain adjustable low noise amplifier.

2. Description of the Related Art

FIG. 1 is a circuit diagram of a conventional broad-band gain adjustable low noise amplifier. Referring to FIG. 1, the low noise amplifier 100 includes a dual feedback amplifier 110, a shunt-shunt feedback amplifier 120 and a gain control unit 130. The dual feedback amplifier 110 has a Kukeilka structure and includes n-type metal oxide semiconductor (NMOS) transistors M1, M2 and Mf1. The gate of the transistor M1 is for receiving a radio-frequency input signal RF_IN and the drain of the transistor M1 is coupled to an operational voltage Vdd, such as 1.8V, via a resistor R1. The gate of the transistor M2 is coupled to the drain of the transistor M1, and the drain of the transistor M2 is coupled to the operational voltage Vdd via a resistor R2 for outputting a first output signal S1. The gate and drain of the transistor Mf1 are commonly coupled to the source of the transistor M2, and coupled to the gate of the transistor M1 via a resistor Rf1. Moreover, a resistor Rf2 is coupled between the gate and drain of the transistor M2 for adjusting the output impedance and thus the gain and linearity of the dual feedback amplifier 110. The drain of the transistor M2 is coupled to a capacitor Cb1 such that the output direct-current (DC) voltage of the transistor M2 has no influence on the bias condition of the shunt-shunt feedback amplifier 120 at the next-stage.

The shunt-shunt feedback amplifier 120 includes a NMOS transistor M3 having its gate coupled to the drain of the transistor M2 via the capacitor Cb1 for receiving the first output signal S1. The transistor M3 is for outputting a radio-frequency output signal RF_OUT at its drain. The drain of the transistor M3 is coupled to the voltage Vdd via a resistor R3 and a resistor Rf3 is coupled between the gate and drain of the transistor M3. Moreover, the gain control unit 130 includes a DC power source Vctrl and a NMOS transistor Mc1. The drain of the transistor Mc1 is coupled to the gate of the transistor M3, and the DC power source Vctrl is coupled to the gate of the transistor Mc1 via resistor Rc1 for adjusting the resistance of the transistor Mc1, wherein the DC power source Vctrl supplies a DC voltage 0~Vdd (1.88V).

Ordinarily when the input signal RF-IN is small, the DC power source Vctrl of the gain control unit 130 adjusts the supplied DC voltage such that the dual feedback amplifier 110 and the shunt-shunt feedback amplifier 120 can operate in a normal operational region (or high gain mode) to achieve the required gain for the low noise amplifier 100. When the input signal RF_IN become large, in order to avoid the saturation of the low noise amplifier 100, the output voltage of the DC power source Vctrl will usually be increased (near 1.8V) to switch the operation mode of the low noise amplifier 100 to a low gain mode. However, in the low gain mode, the linearity of the lower noise amplifier 100 is not good enough, and thus the low noise amplifier 100 cannot increase its tolerance to large input signals.

SUMMARY OF THE INVENTION

It is therefore an object of the invention to provide a low noise amplifier. The gain control unit is coupled to an input terminal of the output transistor in the last-stage amplifier for switching the output-signal gain of the low noise amplifier. When the low noise amplifier is switched from the high gain mode to the low gain mode, the linearity of its output signal can be significantly improved under the situation that the output impedance of the low noise amplifier is unchanged.

The invention achieves the above-identified object by providing a low noise amplifier including a first-stage signal amplifier, a second-stage signal amplifier and a gain control unit. The first-stage signal amplifier is for receiving an input signal and outputting a first output signal accordingly. The second-stage signal amplifier is coupled to the first-stage signal amplifier for outputting a second output signal according to the first output signal. The second-stage signal amplifier includes a first output transistor for outputting the second output signal. The gain control unit includes a first variable resistance device coupled to an input terminal of the first output transistor for adjusting voltage gain of the second output signal.

Other objects, features, and advantages of the invention will become apparent from the following detailed description of the preferred but non-limiting embodiments. The following description is made with reference the accompanying drawings.

DETAILED DESCRIPTION OF THE INVENTION

Figure 1:
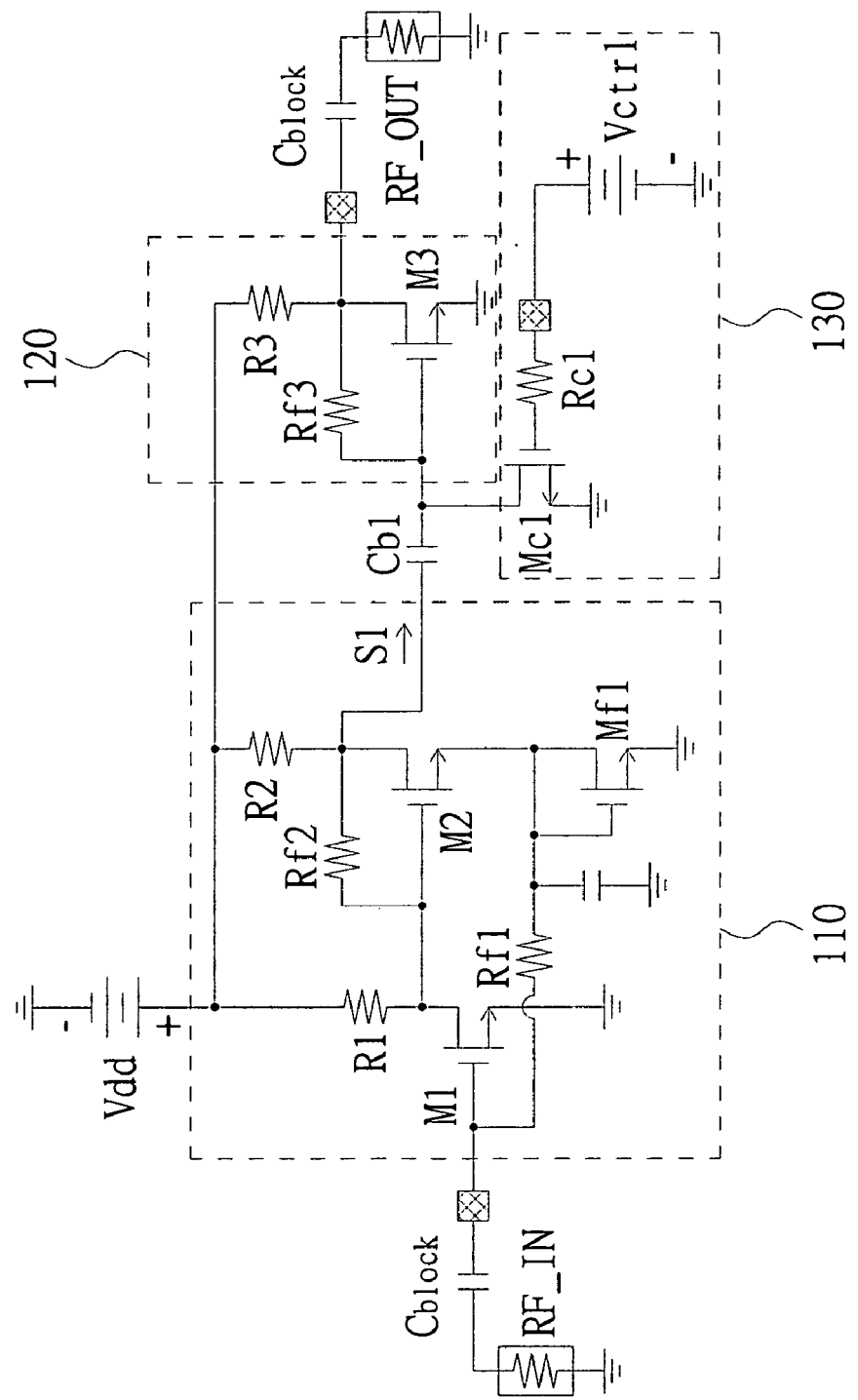
FIG. 1 is a circuit diagram of a conventional broad-band gain adjustable low noise amplifier.
Figure 2:
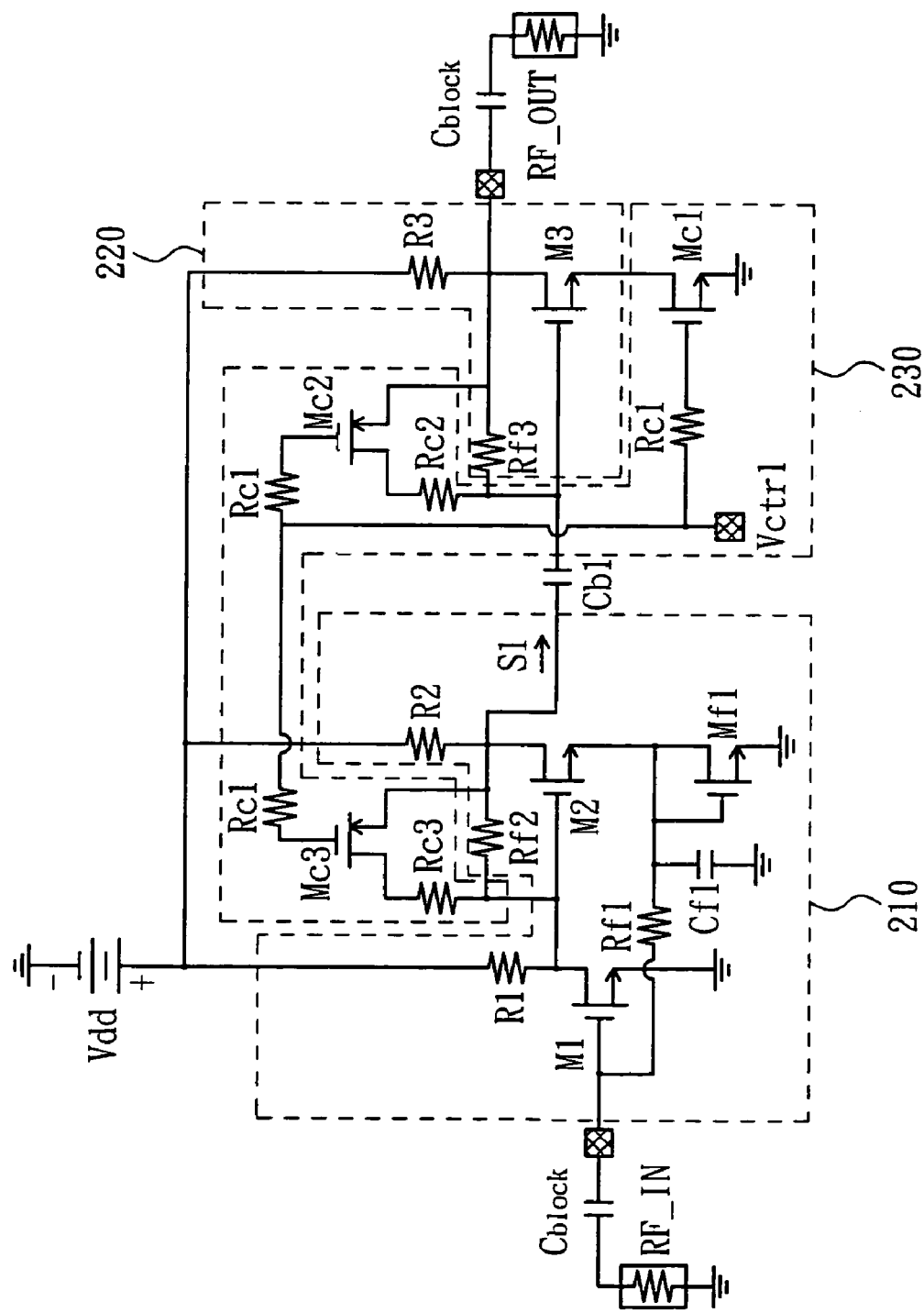
FIG. 2 is a circuit diagram of a broad-band gain adjustable low noise amplifier according to a preferred embodiment of the invention.

Referring to FIG. 2, a circuit diagram of a broad-band gain adjustable low noise amplifier according to a preferred embodiment of the invention is shown. The low noise amplifier 200 includes a first-stage signal amplifier 210, a second-stage signal amplifier 220, and a gain control unit 230. The first-stage signal amplifier 210, such as a dual feedback amplifier, includes NMOS transistors M1, M2, and Mf1. The gate of the transistor M1 is for receiving a radio-frequency input signal RF_IN and the drain of the transistor M1 is coupled to an operational voltage Vdd, such as 1.8V, via a resistor R1. The gate of the transistor M2 is coupled to the drain of the transistor M1, and the drain of the transistor M2 is coupled to the operational voltage Vdd via a resistor R2 for outputting a first output signal S1. A resistor Rf2 is coupled between the gate and drain of the transistor M2. Moreover, the gate and drain of the transistor Mf1 are commonly coupled to the source of the transistor M2 and coupled to the gate of the transistor M1 via a resistor Rf1, and a capacitor Cf1 is coupled to the source of the transistor M2.

The second-stage signal amplifier 220, such as a shunt-shunt feedback amplifier, includes a NMOS transistor M3. The gate of the transistor M3 is coupled to the transistor M2 via a capacitor Cb1 for receiving the first output signal S1, and the drain of the transistor M3 is for outputting a radio-frequency output signal RF_OUT. A resistor Rf3 is coupled between the gate and drain of the transistor M3.

Different from the conventional gain control unit 130, the gain control unit 230 disclosed in the embodiment includes p-type metal oxide semiconductor (PMOS) transistors Mc2 and Mc3 in addition to the transistor Mc1 and the DC power source Vctrl, and the drain of the transistor Mc1 is coupled to the source of the transistor M3. The DC power source Vctrl is coupled to the gates of the transistors Mc1, Mc2 and Mc3 via a resistor Rc1 respectively, wherein the DC power source Vctrl outputs a DC voltage 0~Vdd (1.8V). The source of the transistor Mc2 is coupled to the drain of the transistor M3, and the drain of the transistor Mc2 is coupled to the gate of the transistor M3 via a resistor Rc2. Furthermore, the source of the transistor Mc3 is coupled to the drain of the transistor M2 and the drain of the transistor Mc3 is coupled to the gate of the transistor M2 via a resistor Rc3.

In order to improve the linearity when operating in the low gain mode, the low noise amplifier 200 of the embodiment has the gain control unit 230 coupled to the source of the transistor M3, thus when the low noise amplifier 200 is operated in the low gain mode (Vctrl→1.8V), by changing the source degeneration of the transistor M3, the gain of the low noise amplifier 200 can be reduced and the gain and linearity can be improved at the same time. In contrast, the conventional low noise amplifier 100, when operating in the low gain mode, will have the transistor M3 turned off and have the output radio-frequency output signal RF_OUT pulled high.

When the input signal RF_IN is small, the DC power source Vctrl of the gain control unit 230 supplies a DC voltage 1.8V. At the time, the transistor Mc1 is turned on to ground the source of the transistor M3, and the low noise amplifier 200 is operated in the high gain mode to provide the output signal RF_OUT of a higher gain. Conversely, when the input signal RF_IN is large, in order to avoid the saturation of the low noise amplifier 200, the DC power source Vctrl of the gain control unit 230 supplies a DC voltage 0V to operate the low noise amplifier 200 in the low gain mode. At the same time, due to the increase in the source degeneration of the transistor M3, the linearity of the output signal RF_OUT is significantly improved. Owing that the transistor Mc1 is turned off as the DC power source Vctrl outputs the voltage 0V, the outputs impedance of the low noise amplifier 200 will be enlarged. In order to maintain a constant output impedance as the low noise amplifier 200 is switched to the low gain mode, the transistor Mc2 and the resistor Rc2 are coupled between the drain and gate of the transistor M3 for adjusting the output impedance. In addition, the transistor Mc3 and the resistor Rc3 are coupled between the drain and gate of the transistor M2 for increasing the gain variable range of the output signal RF_OUT. Therefore, when the low noise amplifier 200 of the embodiment is switched to the low gain mode, the linearity of the output signal RF_OUT can be improved without changing the output impedance.

According to a practical measurement on the gain of the conventional low noise amplifier 100 and the low noise amplifier 200 of the invention, the measured data show that when the input signal RF_IN has a frequency 40~900 MHz, the operation voltage Vdd is 1.8V, and the output/input impedance of the two low noise amplifiers 100 and 200 are both 75Ω, the gain (i.e. input $P_{1dB}$) of the conventional low noise amplifier 100 as operated in the high gain mode and low gain mode is −19.5~20.3 dBm and −16.8~20.7 dBm respectively, two of them are only a little different. The gain of the improved low noise amplifier 200 of the invention as operated in the high gain mode and low gain mode is −19.8~22.7 dBm and −11~13.6 dBm respectively. That is, when the low noise amplifier 200 of the invention is switched to the low gain mode, the linearity of the output signal RF_OUT can be improved dramatically and the increase on the gain can even reach 10 dB as compared to the prior-art low noise amplifier 100.

As mentioned above, although the gain control unit 230 in the low noise amplifier 200 of the invention is exemplified to include the NMOS transistor Mc1, the DC power source Vctrl and the PMOS transistors Mc2 and Mc3, and the first-stage signal amplifier 210 and the second-stage signal amplifier 220 are exemplified to include the NMOS transistors M2 and M3 respectively, the transistors M2, M3, and Mc1 can also be PMOS transistors while the transistors Mc2 and Mc3 are NMOS transistors, or other types (syc as BJT) of transistors M2, M3, Mc1, Mc2 and Mc3 can also be used. Or the gain control unit 230 can also include a first variable resistance device, a second variable resistance device and a third variable resistance device. The first variable resistance device is coupled to the source of the transistor M3, the second variable resistance device is coupled between the gate and drain of the transistor M2, whilst the third variable resistance device is coupled between the gate and drain of the transistor M3. As long as the first variable resistance device can be used to change the source degeneration of the transistor M3, and the second and the third variable resistance devices can be used for adjusting the input impedance of the low noise amplifier to achieve the purpose of increasing the linearity of the low gain mode, all these will not depart from the scope of the invention.

The advantage of the low noise amplifier disclosed by the above-mentioned embodiment of the invention is that by coupling the gain control unit to the source of the output transistor in the last-stage amplifier, the linearity of the output signal can be improved without changing the output impedance as the low noise amplifier is switched from the high gain mode to the low gain mode. Therefore, the low noise amplifier can have higher tolerance to large input signals.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A low noise amplifier (LNA), comprising:
  a first-stage signal amplifier, comprising:
    a first transistor configured to receive a radio-frequency (RF) input signal at it gate;
    a second transistor outputting a first output signal at its drain;
    a first feedback circuit coupled between a source of the second transistor and the gate of the first transistor; and
    a second feedback circuit coupled between the gate and the drain of the second transistor;
  a second-stage signal amplifier, comprising:
    an output transistor having its gate coupled to the drain of the second transistor and having its drain outputting a second output signal according to the first output signal; and
    a third feedback circuit coupled between the drain and the gate of the output transistor; and
  a gain control unit comprising a first variable resistance device coupled to the source of the output transistor to change source degeneration of the output transistor.

2. The low noise amplifier according to claim 1, wherein the gain control unit further comprises a second variable resistance device coupled to the drain and the gate of the second transistor.

3. The low noise amplifier according to claim 1, wherein the gain control unit further comprises a third variable resistance device coupled to the drain and the gate of the output transistor.

4. The low noise amplifier according to claim 1, wherein the gain control unit further comprises:
 a second variable resistance device, coupled between the drain and the gate of the second transistor; and
 a third variable resistance device coupled between the drain and the gate of the output transistor.

5. The low noise amplifier according to claim 1, 2, 3 or 4, wherein the first variable resistance device comprises a first control transistor having its drain coupled to the source of the output transistor and its gate coupled to a DC control voltage.

6. The low noise amplifier according to claim 2 or 4, wherein the second variable resistance device comprises a second control transistor having its source and drain coupled to the drain and gate of the second transistor and having its gate coupled to a DC control voltage.

7. The low noise amplifier according to claim 3 or 4, wherein the third variable resistance device comprises a third control transistor having its source and drain coupled to the drain and gate of the output transistor and having its gate coupled to a DC control voltage.

8. The low noise amplifier according to claim 1, wherein the first feedback circuit comprises:
 a feedback transistor having its gate and drain commonly coupled to the source of the second transistor;
 a first feedback resistor coupled between the source of the second transistor and the gate of the first transistor; and
 a first feedback capacitor coupled to the source of the second transistor.

9. The low noise amplifier according to claim 1, wherein the second feedback circuit is a resistor coupled between the drain and the gate of the second transistor.

10. The low noise amplifier according to claim 1, wherein the third feedback circuit is a resistor coupled between the drain and the gate of the output transistor.

* * * * *